(12) United States Patent
Li

(10) Patent No.: US 9,825,113 B2
(45) Date of Patent: Nov. 21, 2017

(54) DOUBLE-SIDED DISPLAY SUBSTRATE AND MANUFACTURING METHOD THEREOF AND DISPLAY DEVICE

(71) Applicants: BOE TECHNOLOGY GROUP CO., LTD., Beijing (CN); Chengdu BOE Optoelectronics Technology Co., Ltd., Chengdu, Sichuan Province (CN)

(72) Inventor: Kun Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 15/083,944

(22) Filed: Mar. 29, 2016

(65) Prior Publication Data

US 2017/0077204 A1 Mar. 16, 2017

(30) Foreign Application Priority Data

Sep. 14, 2015 (CN) .......................... 2015 1 0583897

(51) Int. Cl.
*H01L 27/32* (2006.01)
*H01L 27/12* (2006.01)

(52) U.S. Cl.
CPC ...... *H01L 27/3267* (2013.01); *H01L 27/3248* (2013.01); *H01L 27/3258* (2013.01);
(Continued)

(58) Field of Classification Search
CPC ............. H01L 27/3267; H01L 27/3248; H01L 27/3258; H01L 27/3262; H01L 27/3276;
(Continued)

(56) References Cited

U.S. PATENT DOCUMENTS 8,853,702 B2 10/2014 Jin et al.
2007/0132379 A1* 6/2007 Huang ................ H01L 27/3248
313/506

(Continued)

FOREIGN PATENT DOCUMENTS

CN 201812823 U 4/2011
CN 102629664 A 8/2012
CN 103730485 A 4/2014

*Primary Examiner* — Karen Kusumakar
(74) *Attorney, Agent, or Firm* — Nath, Goldberg & Meyer; Joshua B. Goldberg

(57) ABSTRACT

The present invention provides a double-sided display substrate and a manufacturing method thereof and a display device. The double-sided display substrate includes several sub-pixel units, the sub-pixel unit includes a front side light-emitting layer provided for front side displaying, a back side light-emitting layer provided for back side displaying, a pixel electrode layer, a common electrode layer, and a driving transistor, and the front side light-emitting layer and the back side light-emitting layer are interposed between a corresponding pixel electrode layer and the common electrode layer, respectively, the common electrode layer corresponding to the back side light-emitting layer and/or the front side light-emitting layer is disposed in the same layer as a gate electrode layer of the driving transistor. According to the double-sided display substrate, quick manufacture and spread of the double-sided display substrate are realized.

20 Claims, 7 Drawing Sheets

(52) U.S. Cl.
CPC ...... *H01L 27/3262* (2013.01); *H01L 27/3276* (2013.01); *H01L 27/124* (2013.01); *H01L 27/1248* (2013.01); *H01L 27/1259* (2013.01); *H01L 2227/323* (2013.01)

(58) Field of Classification Search
CPC ............... H01L 27/124; H01L 27/1248; H01L 27/1259; H01L 2227/323
See application file for complete search history.

(56) References Cited

U.S. PATENT DOCUMENTS

2009/0051285 A1* 2/2009 Kajiyama ........... H01L 51/5262
 313/506
2014/0306204 A1* 10/2014 Niu ........................ H01L 51/56
 257/40

* cited by examiner

DOUBLE-SIDED DISPLAY SUBSTRATE AND MANUFACTURING METHOD THEREOF AND DISPLAY DEVICE

FIELD OF THE INVENTION

The present invention relates to the field of display technology, and particularly, relates to a double-sided display substrate and a manufacturing method thereof and a display device.

BACKGROUND OF THE INVENTION

A display product with thin film transistor as a control element and organic light-emitting device (OLED) as a light-emitting medium has drawn increasing attention due to its high definition, wide view angle, easy flexible display and the like.

With the application of the OLED display, an OLED display screen having double-sided display function is required in increasing number of situations. As far, an OLED display screen with double-sided display function implements a double-sided display effect mainly by bonding two OLED screens 10 with single-sided display function together, as shown in FIG. 1. This method is complicated in the manufacturing process, because every film layer structure and the thin film transistor driving circuit in the OLED screen will be manufactured in double, resulting to not only impeding the reduction of the manufacturing costs and the energy consumption cost of the double-sided OLED display screen, but also bringing disadvantages such as having large thickness and great volume and weight etc.; and in the meantime, the yield of the OLED double-sided display screen and the display quality thereof may be influenced. The above-mentioned disadvantages not noly prolong the production cycle of the OLED double-sided display screen, but also impede the quick spread of the OLED double-sided display screen in the market.

SUMMARY OF THE INVENTION

In view of the above-mentioned technical problems in the related art, the present invention provides a double-sided display substrate and a manufacturing method thereof and a display device. In the double-sided display substrate, not only the thickness and the volume of the double-sided display substrate are effectively reduced, the manufacturing costs and the energy consumption costs of the double-sided display substrate are reduced, the difficulty in design are simplified, but also the production cycle of the display substrate is reduced, the yield of the display substrate and the display quality thereof are improved, such that quick manufacture and spead of the double-sided display substrate are realized.

The present invention provides a double-sided display substrate comprising several sub-pixel units disposed in a pixel area, the sub-pixel unit includes a front side light-emitting layer provided for front side displaying, a back side light-emitting layer provided for back side displaying, a pixel electrode layer, a common electrode layer, and a driving transistor, and each of the front side light-emitting layer and the back side light-emitting layer is interposed between a corresponding pixel electrode layer and the common electrode layer, the driving transistor controls the front side light-emitting layer and the back side light-emitting layer to emit light, the common electrode layer corresponding to the back side light-emitting layer and/or the front side light-emitting layer is disposed in the same layer as a gate electrode layer of the driving transistor.

Preferably, the sub-pixel unit includes a driving transistor, the driving transistor controls the front side light-emitting layer and the back side light-emitting layer commonly; the front side light-emitting layer and the back side light-emitting layer share the same pixel electrode layer, the common electrode layer include a first common electrode layer corresponding to the front side light-emitting layer and a second common electrode layer corresponding to the back side light-emitting layer, the second common electrode layer is disposed in the same layer as the gate electrode layer, the pixel electrode layer is connected to the driving transistor.

Preferably, the double-sided display substrate further includes a base substrate, the driving transistor is disposed on the base substrate, the gate electrode layer of the driving transistor is located above an active region thereof, a gate insulating layer is interposed between the gate electrode layer and the active region, the gate electrode layer is disposed at a same layer as the second common electrode layer;

a first insulating layer is disposed on the gate electrode layer, a first opening area is formed at a position on the first insulating layer corresponding to the second common electrode layer, the back side light-emitting layer is disposed at a position on the first insulating layer corresponding to the first opening area, the back side light-emitting layer is connected to the second common electrode layer through the first opening area;

the pixel electrode layer is disposed on the back side light-emitting layer, the pixel electrode layer is connected to the back side light-emitting layer; a first via is formed at a position in the first insulating layer and the gate insulating layer corresponding to a drain of the driving transistor, the pixel electrode layer is connected to the drain through the first via;

a second insulating layer is disposed on the pixel electrode layer, a second opening area is formed at a position on the second insulating layer corresponding to the pixel electrode layer, the front side light-emitting layer is disposed at a position on the second insulating layer corresponding to the second opening area, the front side light-emitting layer is connected to the pixel electrode layer through the second opening area;

the first common electrode layer is disposed on the front side light-emitting layer, and the first common electrode layer is connected to the front side light-emitting layer.

Preferably, the sub-pixel unit includes a first driving transistor provided for controlling the front side light-emitting layer to emit light and a second driving transistor provided for controlling the back side light-emitting layer to emit light, the first driving transistor and the second driving transistor share the same gate electrode layer, the pixel electrode layer includes a first pixel electrode layer corresponding to the front side light-emitting layer and a second pixel electrode layer corresponding to the back side light-emitting layer, the front side light-emitting layer and the back side light-emitting layer share the same common electrode layer, the common electrode layer is disposed in the same layer as the gate electrode layer.

Preferably, on a projection plane parallel to display surfaces of the double-sided display substrate, projections of the first driving transistor and the second driving transistor are overlapped, projections of the front side light-emitting layer, the back side light-emitting layer, the first pixel electrode layer, the second pixel electrode layer and the common electrode layer are overlapped;

the front side light-emitting layer and the first pixel electrode layer are disposed sequentially on a side of the common electrode layer far away from the back side light-emitting layer, the back side light-emitting layer and the second pixel electrode layer are disposed sequentially on a side of the common electrode layer far away from the front side light-emitting layer; the front side light-emitting layer and the back side light-emitting layer are symmetrical with respect to the common electrode layer, the first pixel electrode layer and the second pixel electrode layer are symmetrical with respect to the common electrode layer, and the first pixel electrode layer, the front side light-emitting layer, the common electrode layer, the back side light-emitting layer and the second pixel electrode layer are contacted and connected with each other;

an active region of the first driving transistor and a source and a drain of the first driving transistor disposed at opposite ends on a side of the active region far away from the gate electrode layer, and an active region of the second driving transistor and a source and a drain of the second driving transistor disposed at opposite ends on a side of the active region far away from the gate electrode layer are symmetrical with respect to the gate electrode layer, a first gate insulating layer is interposed between the active region of the first driving transistor and the gate electrode layer, and a second gate insulating layer is interposed between the active region of the second driving transistor and the gate electrode layer;

a third insulating layer is further disposed on a side of the active region of the first driving transistor far away from the gate electrode layer, a second via is formed at a position of the third insulating layer corresponding to the drain of the first driving transistor, the first pixel electrode layer is connected to the drain of the first driving transistor through the second via; a fourth insulating layer is further disposed on a side of the active region of the second driving transistor far away from the gate electrode layer, a third via is formed at a position of the fourth insulating layer corresponding to the drain of the second driving transistor, the second pixel electrode is connected to the drain of the second driving transistor through the third via.

Preferably, the sub-pixel unit includes a first driving transistor provided for controlling the front side light-emitting layer to emit light and a second driving transistor provided for controlling the back side light-emitting layer to emit light, the first driving transistor and the second driving transistor share the same gate electrode layer, the pixel electrode layer includes a first pixel electrode layer corresponding to the front side light-emitting layer and a second pixel electrode layer corresponding to the back side light-emitting layer, the common electrode layer includes a first common electrode layer corresponding to the front side light-emitting layer and a second common electrode layer corresponding to the back side light-emitting layer, the first common electrode layer, the second common electrode layer and the gate electrode layer are disposed in the same layer.

Preferably, on a projection plane parallel to display surfaces of the double-sided display substrate, projections of the first driving transistor and the second driving transistor are overlapped, projections of the first common electrode layer and the second common electrode layer are located at both sides of the projection of the gate electrode layer, respectively;

the front side light-emitting layer and the first pixel electrode layer are sequentially disposed on a side of the first common electrode layer far away from the back side light-emitting layer, and the first common electrode layer, the front side light-emitting layer and the first pixel electrode layer are located at positions corresponding to each other and contacted with each other; the back side light-emitting layer and the second pixel electrode layer are sequentially disposed on a side of the second common electrode layer far away from the front side light-emitting layer, and the second common electrode layer, the back side light-emitting layer and the second pixel electrode layer are located at positions corresponding to each other and contacted with each other;

an active region of the first driving transistor and a source and a drain of the first driving transistor disposed at opposite ends on a side of the active region far away from the gate electrode layer and an active region of the second driving transistor and a source and a drain of the second driving transistor disposed at opposite ends on a side of the active region far away from the gate electrode layer are symmetrical with respect to the gate electrode layer, a first gate insulating layer is interposed between the active region of the first driving transistor and the gate electrode layer, and a second gate insulating layer is interposed between the active region of the second driving transistor and the gate electrode layer;

a third insulating layer is further disposed on a side of the active region of the first driving transistor far away from the gate electrode layer, a second via is formed at a position of the third insulating layer corresponding to the drain of the first driving transistor, the first pixel electrode layer is connected to the drain of the first driving transistor through the second via; a fourth insulating layer is further disposed on a side of the active region of the second driving transistor far away from the gate electrode layer, a third via is formed at a position of the fourth insulating layer corresponding to the drain of the second driving transistor, the second pixel electrode is connected to the drain of the second driving transistor through the third via.

Preferably, the common electrode layer includes a transparent conductive material layer, the gate electrode layer includes at least two conductive material layers, the undermost conductive material layer of the gate electrode layer, which is closest to the back side light-emitting layer, is made of the same transparent conductive material as the common electrode layer, the conductive material layer above the undermost conductive material layer of the gate electrode layer is made of conductive metal material.

Preferably, a signal line in a signal line region out of the pixel area has the same structure as the gate electrode layer.

The present invention also provides a display device comprising the above-mentioned double-sided display substrate.

The present invention also provides a method for manufacturing the above-mentioned double-sided display substrate comprising the steps of: forming the driving transistor, the front side light-emitting layer, the back side light-emitting layer, the pixel electrode layer and the common electrode layer on the base substrate, each of the front side light-emitting layer and the back side light-emitting layer is interposed between a corresponding pixel electrode layer and the corresponding common electrode layer, the common electrode layer corresponding to the back side light-emitting layer and/or the front side light-emitting layer is formed simultaneously with the gate electrode layer of the driving transistor using a single patterning process.

The present invention has following advantage effects: in the double-sided display substrate provided by the present invention, since the common electrode layer corresponding to the back side light-emitting layer and/or the front side light-emitting layer is disposed in the same layer as the gate electrode layer of the driving transistor, the manufacturing of the double-sided display substrate can be implemented without influencing the existing process and increasing the complexity thereof. Not only the thickness and the volume of the double-sided display substrate are effectively reduced, the manufacturing cost and the energy consumption cost of the double-sided display substrate are reduced, the difficulty in design is reduced, but also the production cycle of the display substrate is reduced, the yield of the display substrate and the display quality thereof are improved, such that quick manufacture and spread of the double-sided display substrate are realized.

In the display device provided by the present invention, by using the above-mentioned double-sided display substrate, not only the manufacturing cost and the energy consumption cost of the display device are reduced, but also the production cycle of the display device is reduced, such that the yield of the display device and the display quality thereof are improved.

Figure 1:
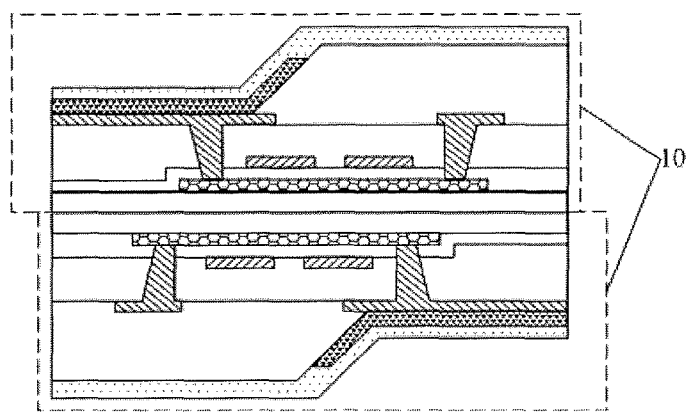
FIG. 1 is a structural sectional view illustrating a double-sided display OLED display screen in the related art.

DESCRIPTION OF THE REFERENCE SIGNS 1. front side light-emitting layer;
2. back side light-emitting layer;
3. pixel electrode layer;
31. first pixel electrode layer;
32. second pixel electrode layer;
4. common electrode layer;
41. first common electrode layer;
42. second common electrode layer;
5. driving transistor;
51. first driving transistor;
510. active region of the first driving transistor;
511. source of the first driving transistor;
512. drain of the first driving transistor;
513. first gate insulating layer;
52. second driving transistor;
520. active region of the second driving transistor;
521. source of the second driving transistor;
522. drain of the second driving transistor;
523. second gate insulating layer;
533. third insulating layer;
5330. second via;
543. fourth insulating layer;
5430. third via;
500. gate electrode layer;
5001. bottom layer film;
5002. upper layer film;
501. active region;
502. gate insulating layer;
503. first insulating layer;
504. first opening area;
505. first via;
506. second insulating layer;
507. second opening area;
508. fourth via;
509. fifth via;
600. sixth via;
6. base substrate;
7. signal line;
71. data signal line;
72. scan signal line;
81. photoresist layer with large thickness;
82. photoresist layer with small thickness;
9. data electrode layer;
10. single-sided display OLED screen.

DETAILED DESCRIPTION OF THE EMBODIMENTS

To provide a better understanding of the technical solution of the present invention for those skilled in the art, a double-sided display substrate and a manufacturing method thereof and a display device provided by the present invention will be further described in detail with reference to the accompanying drawings and the detailed description.

The present invention provides a double-sided display substrate including several sub-pixel units disposed in a pixel area, the sub-pixel unit includes a front side light-emitting layer provided for front side displaying, a back side light-emitting layer provided for back side displaying, a pixel electrode layer, a common electrode layer and a driving transistor. The front side light-emitting layer and the back side light-emitting layer are interposed between a pixel electrode layer and a common electrode layer corresponding thereto, respectively. The driving transistor controls the front side light-emitting layer and the back side light-emitting layer to emit light. The common electrode layer corresponding to the back side light-emitting layer and/or the front side light-emitting layer is disposed in the same layer as a gate electrode layer of the driving transistor.

By disposing the common electrode layer corresponding to the back side light-emitting layer and/or the front side light-emitting layer in the same layer as a gate electrode layer of the driving transistor, the double-sided display substrate can be manufactured without influencing or increasing the existing process difficulties. Not only the thickness and the volume of the double-sided display substrate can be effectively reduced, the manufacturing cost and the energy consumption cost of the double-sided display substrate is reduced, the difficulty in design is relieved, but also the production cycle of the display substrate can be shortened, the yield of the display substrate and the display quality thereof are improved, so that quick manufacture and spread of the double-sided display substrate can be realized.

Embodiment 1

Figure 2:
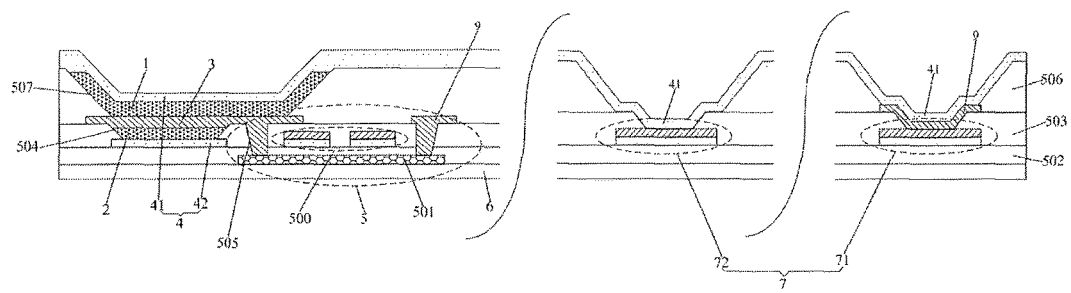
FIG. 2 is a structural sectional view illustrating a double-sided display substrate in an embodiment 1 of the present invention.

The present invention provides a double-sided display substrate including several sub-pixel units disposed in a pixel area, as shown in FIG. 2, the sub-pixel unit includes a front side light-emitting layer 1 provided for front side displaying, a back side light-emitting layer 2 provided for back side displaying, a pixel electrode layer 3, a common electrode layer 4 and a driving transistor 5. Each of the front side light-emitting layer 1 and the back side light-emitting layer 2 is interposed between a corresponding pixel electrode layer 3 and a common electrode layer 4. The driving transistor 5 controls the front side light-emitting layer 1 and the back side light-emitting layer 2 to emit light. The common electrode layer 4 corresponding to the back side light-emitting layer 2 is disposed in the same layer as a gate electrode layer 500 of the driving transistor 5.

In the present embodiment, the sub-pixel unit includes a driving transistor 5, the driving transistor 5 controls the front side light-emitting layer 1 and the back side light-emitting layer 2 commonly. The front side light-emitting layer 1 and the back side light-emitting layer 2 share the same pixel electrode layer 3. The common electrode layer 4 include a first common electrode layer 41 corresponding to the front side light-emitting layer 1 and a second common electrode layer 42 corresponding to the back side light-emitting layer 2, the second common electrode layer 42 is disposed in the same layer as the gate electrode layer 500, the pixel electrode layer 3 is connected to the driving transistor 5. With this arrangement, the second common electrode layer 42 and the gate electrode layer 500 can be formed simultaneously in a single patterning process, such that the number of processes for manufacturing the double-sided display substrate is reduced, and thus the production cycle of the double-sided display substrate is reduced; in the meantime, with the above-mentioned arrangement, the double-sided display substrate of the present embodiment has a reduced thickness, a reduced weight, and a reduced volume with respect to the conventional double-sided display substrate, such that the manufacturing cost and the energy consumption cost can be saved, and the yield of the double-sided display substrate and the display quality thereof can be improved.

In the present embodiment, the double-sided display substrate further includes a base substrate 6, the driving transistor 5 is disposed on the base substrate 6, the gate electrode layer 500 of the driving transistor 5 is located above an active region 501 thereof, a gate insulating layer 502 is interposed between the gate electrode layer 500 and the active region 501, the gate electrode layer 500 is disposed at the same layer as the second common electrode layer 42. A first insulating layer 503 is disposed on the gate electrode layer 500, a first opening area 504 is formed at a position on the first insulating layer 503 corresponding to the second common electrode layer 42, the back side light-emitting layer 2 is disposed at a position on the first insulating layer 503 corresponding to the first opening area 504, the back side light-emitting layer 2 is connected to the second common electrode layer 42 through the first opening area 504. The pixel electrode layer 3 is disposed on the back side light-emitting layer 2, the pixel electrode layer 3 is connected to the back side light-emitting layer 2; a first via 505 is formed at a position in the first insulating layer 503 and the gate insulating layer 502 corresponding to a drain of the driving transistor 5, the pixel electrode layer 3 is connected to the drain through the first via 505. A second insulating layer 506 is disposed on the pixel electrode layer 3, a second opening area 507 is formed at a position in the second insulating layer 506 corresponding to the pixel electrode layer 3, the front side light-emitting layer 1 is disposed at a position on the second insulating layer 506 corresponding to the second opening area 507, the front side light-emitting layer 1 is connected to the pixel electrode layer 3 through the second opening area 507. The first common electrode layer 41 is disposed on the front side light-emitting layer 1, the first common electrode layer 41 is connected to the front side light-emitting layer 1. In the case where the front side light-emitting layer 1 and the back side light-emitting layer 2 share the same pixel electrode layer 3, and the second common electrode layer 42 and the gate electrode layer 500 are disposed in the same layer, the double-sided display substrate may have a further reduced overall thickness, a further reduced weight, and a further reduced volume with respect to the conventional double-sided display substrate, such that the manufacturing cost and the energy consumption cost can be saved.

In the present embodiment, the common electrode layer 4 includes a transparent conductive material layer. The gate electrode layer 500 includes at least two conductive material layers, the undermost conductive material layer of the gate electrode layer 500, which is closest to the back side light-emitting layer 2, is made of the same transparent conductive material as the common electrode layer 4, the other conductive material layer above the undermost conductive material layer of the gate electrode layer 500 is made of conductive metal material. In the present embodiment, both of the first common electrode layer 41 and the second common electrode layer 42 are made of transparent conductive material, through this arrangement, the double-sided display substrate can display normally with light transmitting therethough. The gate electrode layer 500 has a double-layer conductive material structure, that is, the undermost layer of the gate electrode layer 500 is made of transparent conductive material, the upper layer thereof is made of conductive metal material, such that the resistivity of the gate electrode layer 500 can be reduced, and the conductivity thereof can be improved, thereby the gate electrode layer 500 can normally transmit an electric signal for displaying. In addition, in the case where the upper layer of the gate electrode layer 500 is made of conductive metal material, the flexibility of the upper layer is improved, such that the occurrence of defects (such as breakage) of the gate electrode layer 500 can mostly be prevented, thereby the yield of the double-sided display substrates and the display quality thereof can be further improved.

In this case, the transparent conductive material may be a metal-oxide transparent conductive material, such as indium tin oxide, zinc oxide or the like. The conductive metal material may be, for example, copper, silver, aluminium, or the alloy thereof, or the like. It is to be noted that the upper layer of the gate electrode layer 500 can also be made of the transparent conductive material.

In the present embodiment, a signal line 7 in a signal line region out of the pixel area has the same structure as the gate electrode layer 500. In this case, the signal line 7 includes a data signal line 71, a scan signal line 72 and a connecting line, the connecting line has the same structure as the data signal line 71 or the scan signal line 72. The signal line 7 has the same structure as the gate electrode layer 500. Since the conductive metal material has a good ductility and a great conductivity, not only the occurrence of breakage etc. of the signal line 7 in the via region can mostly be prevented, so as to ensure the yield of the double-sided display substrate and the display quality thereof, but also the resistivity of the signal line 7 can be reduced, and the conductivity thereof can be improved, thereby the signal line 7 may obtain a better signal transmission.

In addition, it is to be noted that the first common electrode layer 41 corresponding to the front side light-emitting layer 1 may be disposed in the same layer as the gate electrode layer 500 in the present embodiment, the particular structure thereof is the same as those described for the double-sided display substrate in FIG. 2, therefore the description will be omitted herein.

On the basis of the structure of the above-mentioned double-sided display substrate, the present embodiment also provides a method for manufacturing the double-sided display substrate, the method includes: forming the driving transistor 5, the front side light-emitting layer 1, the back side light-emitting layer 2, the pixel electrode layer 3 and the common electrode layer 4 on the base substrate 6, each of the front side light-emitting layer 1 and the back side light-emitting layer 2 is interposed between a corresponding pixel electrode layer 3 and the common electrode layer 4, the common electrode layer 4 corresponding to the back side light-emitting layer 2 is formed simultaneously with the gate electrode layer 500 of the driving transistor 5 in a single patterning process.

Figure 3:
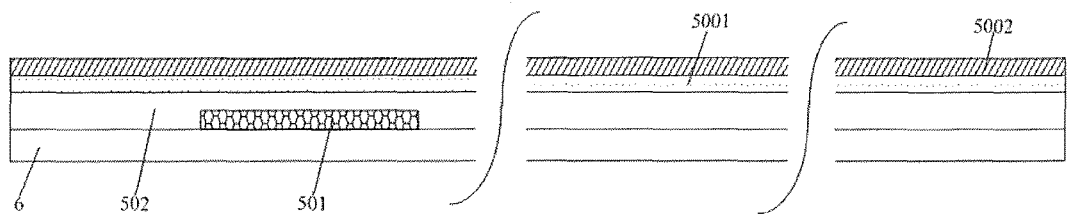
FIG. 3 is a structural sectional view illustrating processes after manufacturing an active region and a gate insulating layer on a base substrate and depositing a gate electrode layer film in step S1 according to the embodiment 1.

Steps of manufacturing the above-mentioned double-sided display substrate are:

Step S1: manufacturing the active region 501 and the gate insulating layer 502 and depositing the gate electrode layer film on the base substrate 6 in sequence, wherein the gate electrode layer film includes a lower layer film 5001 made of the transparent conductive material and a upper layer film 5002 made of the conductive metal material, as shown in FIG. 3.

Figure 4:
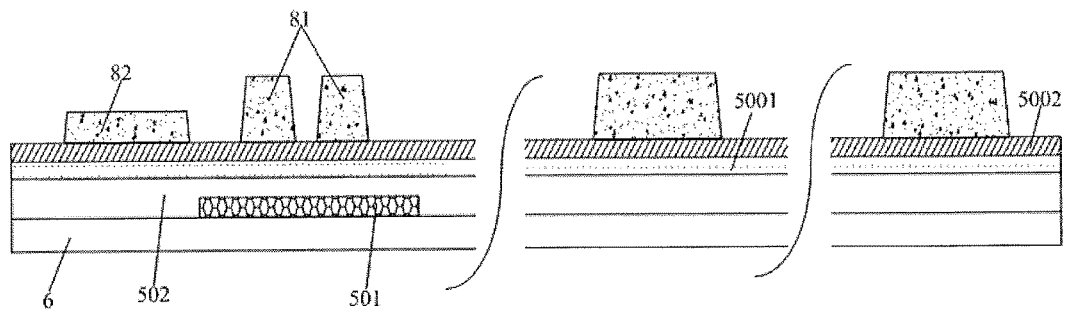
FIG. 4 is a structural sectional view illustrating a structure after exposing and developing the gate electrode layer film on the base substrate in step S2 according to the embodiment 1.

Step S2: coating a photoresist on the base substrate 6 manufactured in the step S1, and exposing and developing the photoresist using a half-tone mask, such that a photoresist layer with thick thickness 81 remains on respective areas on which the gate electrode layer 500 and the signal line 7 are to be formed, and a photoresist layer with thin thickness 82 remains on an area on which the second common electrode layer 42 is to be formed, and removing the photoresist in areas beside those corresponding to the gate electrode layer 500, the signal line 7 and the second common electrode layer 42, as shown in FIG. 4.

Figure 5:
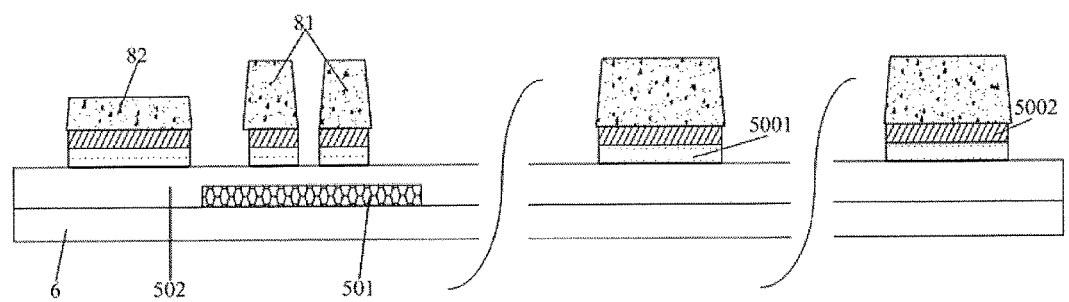
FIG. 5 is a structural sectional view illustrating a structure after etching the gate electrode layer film on the base substrate in step S3 according to the embodiment 1.

Step S3: etching the base substrate 6 manufactured in step S2, so as to remove the gate electrode layer film from those areas not covered by the photoresist, that is, remove parts of the bottom layer film 5001 and the upper layer film 5002 not covered by the photoresist, as shown in FIG. 5.

Figure 6:
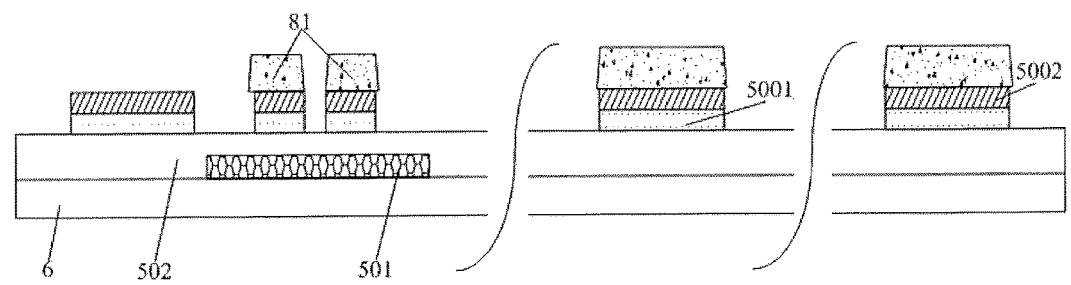
FIG. 6 is a structural sectional view illustrating a structure after ashing a photoresist on the base substrate in step S4 according to the embodiment 1.

Step S4: ashing the photoresist on the base substrate 6 manufactured in step S3, so as to remove the photoresist layer with thin thickness 82 on those areas on which the second common electrode layer 42 is to be formed, and partially remove the photoresist layer with thick thickness 81 on those areas on which the gate electrode layer 500 and the signal line 7 are to be formed, that is, the photoresist with a certain thickness is remained on areas on which the gate electrode layer 500 and the signal line 7 are to be formed, as shown in FIG. 6.

Figure 7:
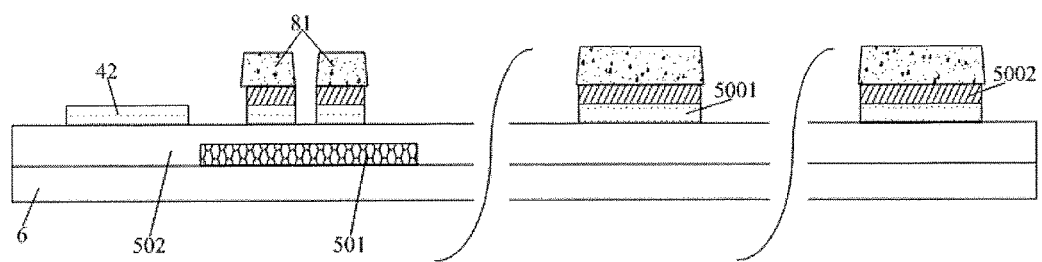
FIG. 7 is a structural sectional view illustrating a structure after etching an upper layer film on the base substrate in step S5 according to the embodiment 1.

Step S5: etching the base substrate 6 manufactured in step S4, so as to remove the upper layer film 5002 (i.e., the conductive metal material layer) of the gate electrode layer film within the areas not covered by the photoresist, and remain the lower layer film 5001 (i.e., the transparent conductive material layer) of the gate electrode layer film within the areas, so far, a pattern of the second common electrode layer 42 is completed, as shown in FIG. 7.

Figure 8:
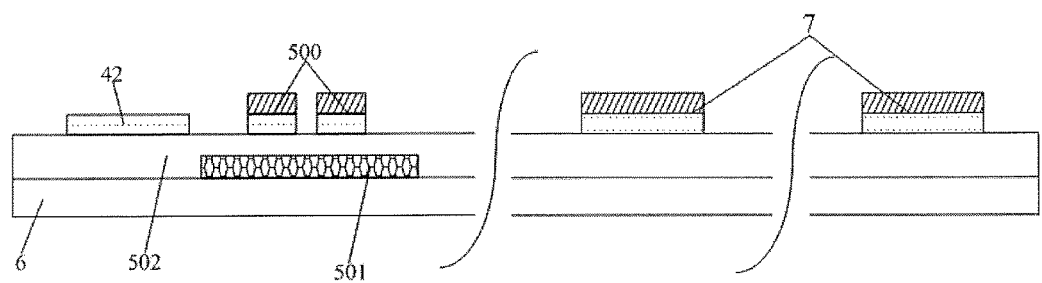
FIG. 8 is a structural sectional view illustrating a structure after removing the photoresist remained on the base substrate in step S6 according to the embodiment 1.

Step S6: removing the photoresist remained on the base substrate 6 manufactured in step S5, such that a pattern of the gate electrode layer 500 and a partial pattern of the signal line 7 are formed, as shown in FIG. 8.

As the second common electrode layer 42 on the base substrate 6, only the lower layer film 5002 (i.e., the transparent conductive layer) of the gate electrode layer film is remained, whereas the gate electrode layer film keeps its two-layered structure in other areas. It is noted that the upper layer, which is made of non-transparent conductive metal material, of the gate electrode layer film may be removed selectively, in said other areas. However, since the gate electrode layer film in said other areas is not used for displaying but mostly for transmitting electric signal only, it is preferable that the gate electrode layer film keeps its two-layered structure in said other areas beside the second common electrode layer 42 in the present embodiment, so as to reduce resistivity and avoid undesired occurrence of signal distortion.

Figure 9:
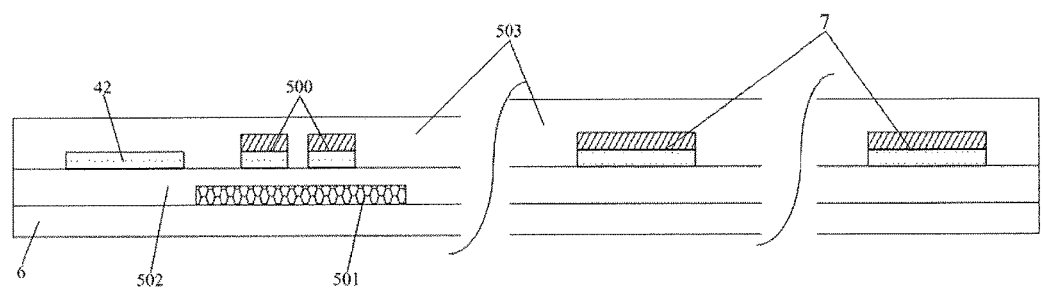
FIG. 9 is a structural sectional view illustrating a structure after depositing a first insulating layer on the base substrate in step S6 according to the embodiment 1.
Figure 10:
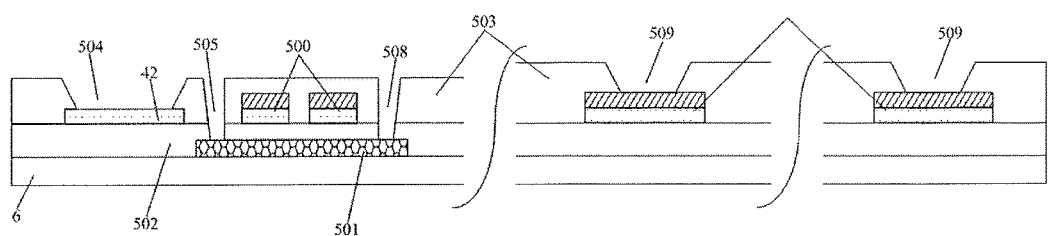
FIG. 10 is a structural sectional view illustrating a structure after photolithographing the first insulating layer on the base substrate in step S7 according to the embodiment 1.

Step S7: depositing the first insulating layer 503 on the base substrate 6 manufactured in step S6, removing the first insulating layer 503 on the second common electrode layer 42 by photolithography process to form the first opening area 504; removing the first insulating layer 503 and the gate insulating layer 502 on the drain of the driving transistor 5 to form the first via 505; removing the first insulating layer 503 and the gate insulating layer 502 on the source of the driving transistor 5 simultaneously to form the fourth via 508; and removing the first insulating layer 503 on the signal line 7 to form the fifth via 509, as shown in FIGS. 9-10.

Figure 11:
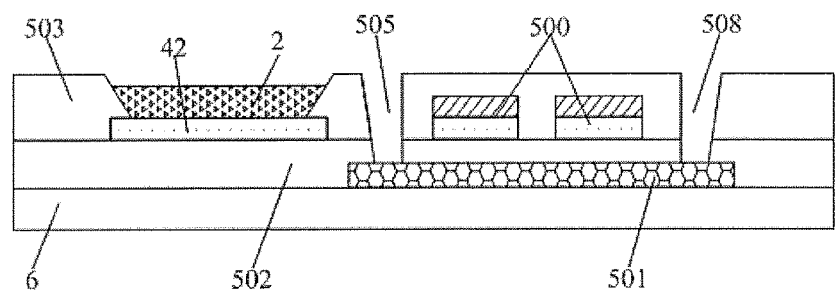
FIG. 11 is a structural sectional view illustrating a process of manufacturing a back side light-emitting layer on the base substrate in step S8 according to the embodiment 1.

Step S8: manufacturing the back side light-emitting layer 2 on the base substrate 6 manufactured in step S7, the back side light-emitting layer 2 and the second common electrode layer 42 are located at corresponding positions and contacted and connected with each other, as shown in FIG. 11.

Figure 12:
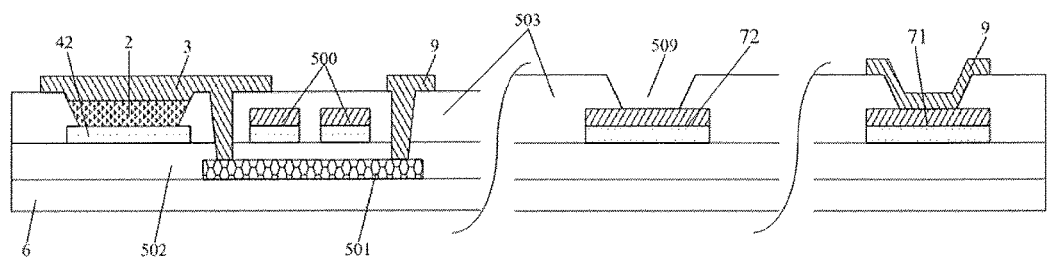
FIG. 12 is a structural sectional view illustrating a process of manufacturing a pixel electrode layer and a data electrode layer on the base substrate in step S9 according to the embodiment 1.

Step S9: manufacturing a structure for forming the pixel electrode layer 3 and the data electrode layer 9 on the base substrate 6 manufactured in step S8, as shown in FIG. 12.

In this case, the pixel electrode layer 3 is formed on the back side light-emitting layer 2, correspondingly, and contact and connect with the back side light-emitting layer 2; the pixel electrode layer 3 and the data electrode layer 9 may be formed of the same material in a single patterning process, or otherwise, may be formed separately; other film layer structures may be presented between the pixel electrode layer 3 and the data electrode layer 9, as long as the pixel electrode layer 3 is ensured to contact and connect with the back side light-emitting layer 2. The data electrode layer 9 is connected to the source of the driving transistor 5 through the fourth via 508. In addition, the data electrode layer 9 may also be formed on corresponding data signal line 71, the data electrode layer 9 is connected to the data signal line 71 through the fifth via 509, such that the introduction of a test signal is easy. Preferably, in order to simplify the manufacturing process, the pixel electrode layer 3 and the data electrode layer 9 are formed of the same materials simultaneously in the technical solution of the present invention.

Figure 13:
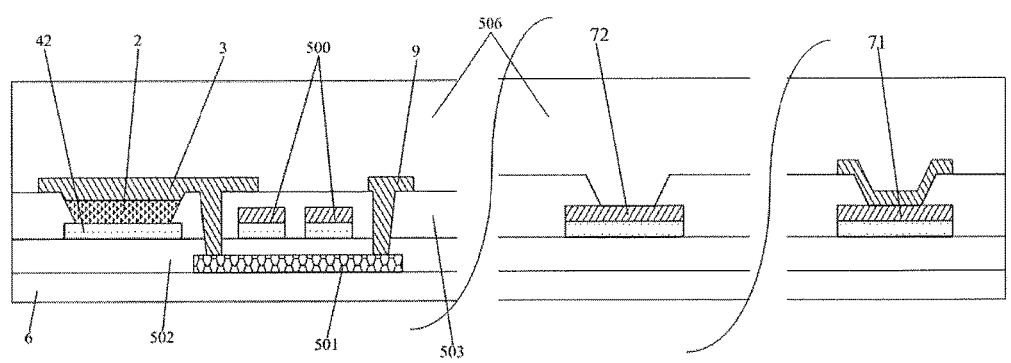
FIG. 13 is a structural sectional view illustrating a process of forming a second insulating layer on the base substrate in step S10 according to the embodiment 1.
Figure 14:
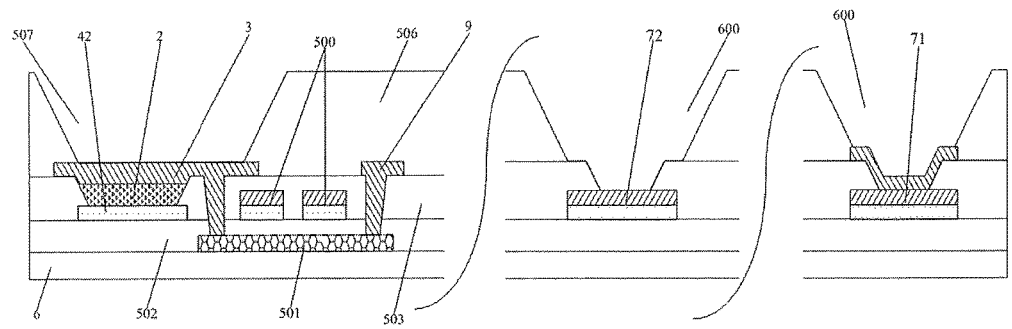
FIG. 14 is a structural sectional view illustrating a structure after photolithographing the second insulating layer on the base substrate in step S10 according to the embodiment 1.

Step S10: forming the second insulating layer 506 on the base substrate 6 manufactured in step S9, removing the second insulating layer 506 on the pixel electrode layer 3 by a photolithography process to form the second opening area 507; and removing the second insulating layer 506 on the signal line 7 to form the sixth via 600, as shown in FIGS. 13-14.

Figure 15:
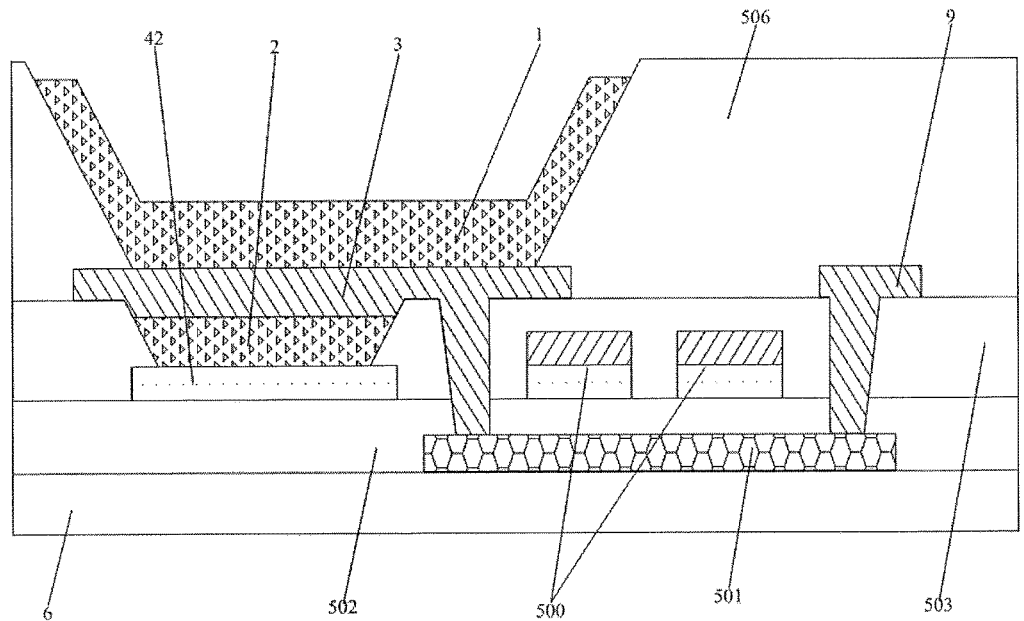
FIG. 15 is a structural sectional view illustrating a process of forming a front side light-emitting layer on the base substrate in step S11 according to the embodiment 1.

Step S11: manufacturing the front side light-emitting layer 1 on the base substrate 6 manufactured in step S10, the front side light-emitting layer 1 and the pixel electrode layer 3 are located at corresponding positions and contacted and connected with each other, as shown in FIG. 15.

In this case, the front side light-emitting layer 1 and the back side light-emitting layer 2 may be made of the same material, or otherwise, may be made of different materials if necessary, the manufacturing process is not limited thereto.

Step S12: forming the first common electrode layer 41 on the base substrate 6 manufactured in step S11; the first common electrode layer 41 is connected to the data electrode layer 9 at a position corresponding to the data signal line 71 through the sixth via 600; the first common electrode layer 41 is connected to the gate electrode layer 500 at a position corresponding to the scan signal line 72 through the fifth via 509 and the sixth via 600, as shown in FIG. 2.

Through this arrangement as mentioned above, the undesired occurrence of breakage etc. of the first common electrode layer 41 in via region can be reduced. In this case, the first common electrode layer 41 is made of transparent conductive material; the first common electrode layer 41 and the second common electrode layer 42 may be made of the same material or different materials; however, the first common electrode layer 41 and the second common electrode layer 42 are made of the same material, that is, the transparent conductive material, in order to simplify the manufacturing process and save the production cost.

Up to now, the manufacturing of the double-sided display substrate is completed.

Embodiment 2

Figure 16:
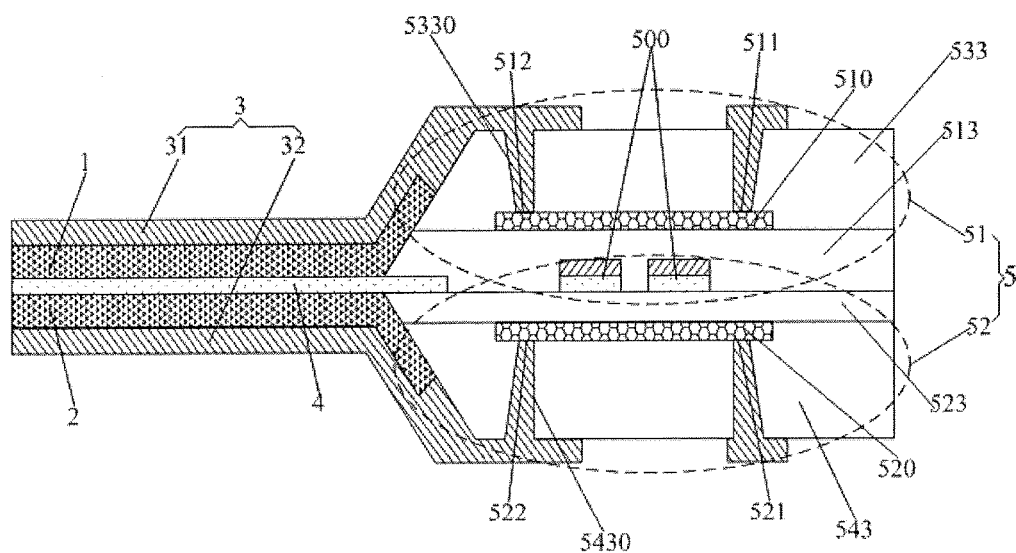
FIG. 16 is a structural sectional view illustrating a double-sided display substrate in an embodiment 2 of the present invention.

The present invention provides a double-sided display substrate, unlike the embodiment 1, as shown in FIG. 16, the sub-pixel unit includes a first driving transistor 51 provided for controlling the front side light-emitting layer 1 to emit light and a second driving transistor 52 provided for controlling the back side light-emitting layer 2 to emit light, the first driving transistor 51 and the second driving transistor 52 share the same gate electrode layer 500; the pixel electrode layer 3 includes a first pixel electrode layer 31 corresponding to the front side light-emitting layer 1 and a second pixel electrode layer 32 corresponding to the back side light-emitting layer 2, the front side light-emitting layer 1 and the back side light-emitting layer 2 share the same common electrode layer 4, the common electrode layer 4 is disposed in the same layer as the gate electrode layer 500.

Through this arrangement as mentioned above, the first driving transistor 51 and the second driving transistor 52 control the front side light-emitting layer 1 and the back side light-emitting layer 2 to emit light, respectively, such that the double-sided display substrate can display different contents on the front side and the back side thereof, and also, can simultaneously display identical content on the front side and the back side thereof, thereby the double-sided display substrate can display flexibly.

In the present embodiment, on a projection plane parallel to display surfaces of the double-sided display substrate, projections of the first driving transistor 51 and the second driving transistor 52 are overlapped, projections of the front side light-emitting layer 1, the back side light-emitting layer 2, the first pixel electrode layer 31, the second pixel electrode layer 32 and the common electrode layer 4 are overlapped. The front side light-emitting layer 1 and the first pixel electrode layer 31 are disposed sequentially on a side of the common electrode layer 4 far away from the back side light-emitting layer 2, the back side light-emitting layer 2 and the second pixel electrode layer 32 are disposed sequentially on a side of the common electrode layer 4 far away from the front side light-emitting layer 1. The front side light-emitting layer 1 and the back side light-emitting layer 2 are symmetrical with respect to the common electrode layer 4, the first pixel electrode layer 31 and the second pixel electrode layer 32 are symmetrical with respect to the common electrode layer 4; and the first pixel electrode layer 31, the front side light-emitting layer 1, the common electrode layer 4, the back side light-emitting layer 2 and the second pixel electrode layer 32 are contacted and connected with each other. An active region 510 of the first driving transistor 51 and a source 511 and a drain 512 of the first driving transistor 51 disposed on opposite ends on a side of the active region 510 far away from the gate electrode layer 500, and an active region 520 of the second driving transistor 52 and a source 521 and a drain 522 of the second driving transistor 52 disposed on opposite ends on a side of the active region 520 far away from the gate electrode layer 500 are symmetrical with respect to the gate electrode layer 500. A first gate insulating layer 513 is interposed between the active region 510 of the first driving transistor 51 and the gate electrode layer 500, and a second gate insulating layer 523 is interposed between the active region 520 of the second driving transistor 52 and the gate electrode layer 500. A third insulating layer 533 is further disposed on a side of the active region 510 of the first driving transistor 51 far away from the gate electrode layer 500, a second via 5330 is formed at a position of the third insulating layer 533 corresponding to the drain 512 of the first driving transistor 51, the first pixel electrode layer 31 is connected to the drain 512 of the first driving transistor 51 through the second via 5330. A fourth insulating layer 543 is further disposed on a side of the active region 520 of the second driving transistor 52 far away from the gate electrode layer 500, a third via 5430 is formed at a position of the fourth insulating layer 543 corresponding to the drain 522 of the second driving transistor 52, the second pixel electrode 32 is connected to the drain 522 of the second driving transistor 52 through the third via 5430.

In the present embodiment, the common electrode layer 4 include a transparent conductive material layer, the gate electrode layer 500 include at least two conductive material layers, the undermost conductive material layer of the gate electrode layer 500, which is closest to the back side light-emitting layer 2, is made of the same transparent conductive material as that of the common electrode layer 4, the layer above the undermost conductive material layer of the gate electrode layer 500 is made of the conductive metal material. Through this arrangement, the double-sided display substrate can display normally with light transmitting therethough. The gate electrode layer 500 has a double-layered conductive material structure, that is, the undermost layer of the gate electrode layer 500 is made of transparent conductive material, the upper layer thereof is made of conductive metal material, such that the resistivity of the gate electrode layer 500 can be reduced, and the conductivity thereof can be improved, thereby the gate electrode layer 500 can normally transmitting an electric signal for displaying. In addition, in the case where the upper layer of the gate electrode layer 500 is made of conductive metal material, the flexibility of the upper layer is improved, such that the occurrence of breakage etc. in the gate electrode layer 500 can mostly be prevented, thereby the yield of the double-sided display substrate and the display quality thereof can be improved.

In the present embodiment, a signal line in a signal line region out of the pixel area has a same structure as the gate electrode layer 500. In this case, the signal line includes a data signal line, a scan signal line and a connecting line, the connecting line has a same structure as the data signal line or the scan signal line. The signal line has a same structure as the gate electrode layer 500. Since the conductive metal material has a good ductility and a great conductivity, not only the occurrence of breakage etc. of the signal line in the via region can mostly be prevented, so as to ensure the yield of the double-sided display substrate and the display quality thereof, but also the resistivity of the signal line can be reduced, and the conductivity thereof can be improved, thereby the signal line may have a better signal transmission.

The method of manufacturing the common electrode layer 4 and the gate electrode layer 500 of the present embodiment is identical to that of the embodiment 1, and the other film layers in the present embodiment are sequentially made by the conventional manufacturing process, therefore the description will be omitted herein.

Embodiment 3

Figure 17:
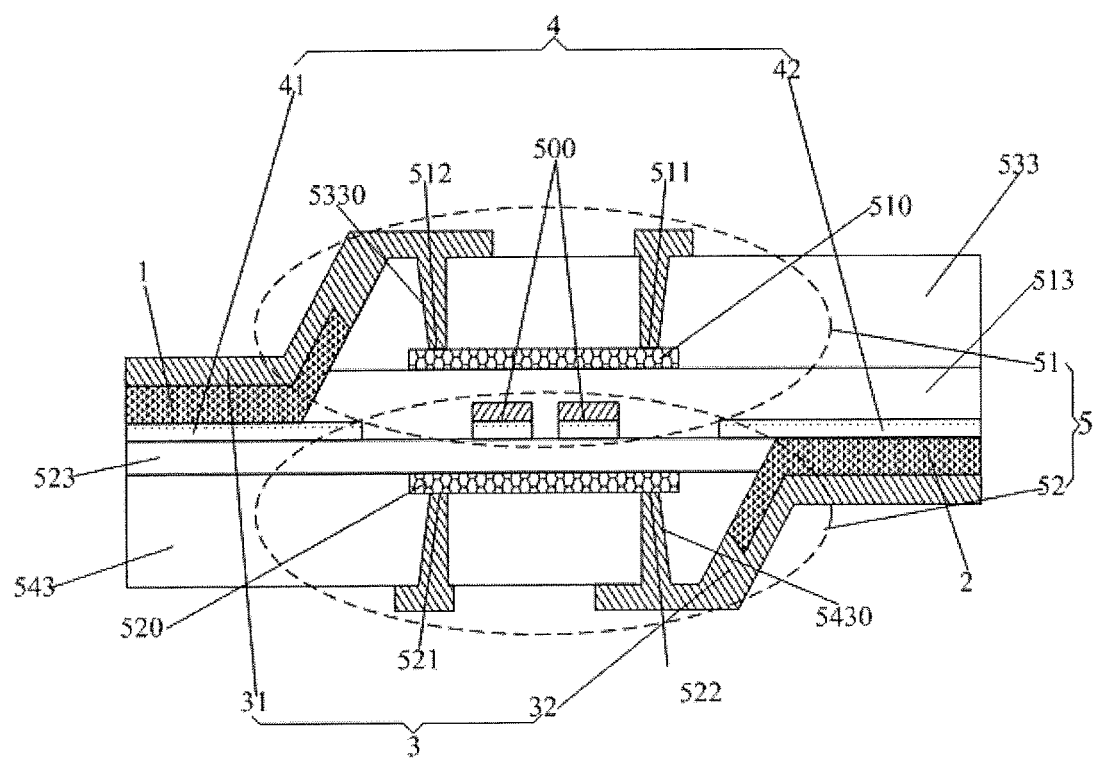
FIG. 17 is a structural sectional view illustrating a double-sided display substrate in an embodiment 3 of the present invention.

The present invention provides a double-sided display substrate, unlike the embodiments 1 and 2, As shown in FIG. 17, a sub-pixel unit includes a first driving transistor 51 provided for controlling the front side light-emitting layer 1 to emit light and a second driving transistor 52 provided for controlling the back side light-emitting layer 2 to emit light, the first driving transistor 51 and the second driving transistor 52 share the same gate electrode layer 500; the pixel electrode layer 3 includes a first pixel electrode layer 31 corresponding to the front side light-emitting layer 1 and a second pixel electrode layer 32 corresponding to the back side light-emitting layer 2, the common electrode layer 4 includes a first common electrode layer 41 corresponding to the front side light-emitting layer 1 and a second common electrode layer 42 corresponding to the back side light-emitting layer 2, the first common electrode layer 41, the second common electrode layer 42 and the gate electrode layer 500 are disposed in the same layer.

Through this arrangement as mentioned above, the first driving transistor 51 and the second driving transistor 52 can also control the front side light-emitting layer 1 and the back side light-emitting layer 2 to emit light, respectively, such that the double-sided display substrate can display different contents on the front side and the back side thereof, and also, can simultaneously display identical content on the front side and the back side thereof, thereby the double-sided display substrate can display flexibly.

In the present embodiment, on a projection plane parallel to display surfaces of the double-sided display substrate, projections of the first driving transistor 51 and the second driving transistor 52 are overlapped, projections of the first common electrode layer 41 and the second common electrode layer 42 are located at both sides of the projection of the gate electrode layer 500, respectively. The front side light-emitting layer 1 and the first pixel electrode layer 31 are sequentially disposed on a side of the first common electrode layer 41 far way from the back side light-emitting layer 2, and the first common electrode layer 41, the front side light-emitting layer 1 and the first pixel electrode layer 31 are located at positions corresponding to each other and contacted with each other, the back side light-emitting layer 2 and the second pixel electrode layer 32 are sequentially disposed on a side of the second common electrode layer 42 far way from the front side light-emitting layer 1, and the second common electrode layer 42, the back side light-emitting layer 2 and the second pixel electrode layer 32 are located at positions corresponding to each other and contacted with each other.

An active region 510 of the first driving transistor 51 and a source 511 and a drain 512 of the first driving transistor 51 disposed at opposite ends on a side of the active region 510 far away from the gate electrode layer 500 and an active region 520 of the second driving transistor 52 and a source 521 and a drain 522 of the second driving transistor 52 disposed at opposite ends on a side of the active region 520 far away from the gate electrode layer 500 are symmetrical with respect to the gate electrode layer 500. A first gate insulating layer 513 is interposed between the active region 510 of the first driving transistor 51 and the gate electrode layer 500, and a second gate insulating layer 523 is interposed between the active region 520 of the second driving transistor 52 and the gate electrode layer 500. A third insulating layer 533 is further disposed on a side of the active region 510 of the first driving transistor 51 far away from the gate electrode layer 500, a second via 5330 is formed at a position of the third insulating layer 533 corresponding to the drain 512 of the first driving transistor 51, the first pixel electrode layer 31 is connected to the drain 512 of the first driving transistor 51 through the second via 5330. A fourth insulating layer 543 is further disposed on a side of the active region 520 of the second driving transistor 52 far away from the gate electrode layer 500, a third via 5430 is formed at a position of the fourth insulating layer 543 corresponding to the drain 522 of the second driving transistor 52, the second pixel electrode 32 is connected to the drain 522 of the second driving transistor 52 through the third via 5430.

In the present embodiment, the first common electrode layer 41 and the second common electrode layer 42 include a transparent conductive material layer respectively, the gate electrode layer 500 includes at least two conductive material layers, the undermost conductive material layer of the gate electrode layer 500, which is closest to the back side light-emitting layer 2, is made of the same transparent conductive material as those of the first common electrode layer 41 and the second common electrode layer 42, the layer above the undermost conductive material layer of the gate electrode layer 500 is made of the conductive metal material. Through this arrangement, the double-sided display substrate can displayed normally with light transmitting therethough. The gate electrode layer 500 has a double-layered conductive material structure, that is, the undermost layer of the gate electrode layer 500 is made of transparent conductive material, the upper layer thereof is made of conductive metal material, such that the resistivity of the gate electrode layer 500 can be reduced, and the conductivity thereof can be improved, thereby the gate electrode layer 500 can normally transmitting an electric signal for displaying. In addition, in the case where the upper layer of the gate electrode layer 500 is made of conductive metal material, the flexibility of the upper layer is improved, such that the occurrence of breakage etc. in the gate electrode layer 500 can mostly be prevented, thereby the yield of the double-sided display substrate and the display quality thereof can be improved.

In the present embodiment, a signal line in a signal line region out of the pixel area has a same structure as the gate electrode layer 500. In this case, the signal line includes a data signal line, a scan signal line and a connecting line, the connecting line has a same structure as the data signal line or the scan signal line. The signal line has a same structure as the gate electrode layer 500. Since the conductive metal material has a good ductility and a great conductivity, not only the occurrence of breakage etc. of the signal line in the via region can mostly be prevented, so as to ensure the yield of the double-sided display substrate and the display quality thereof, but also the resistivity of the signal line can be reduced, and the conductivity thereof can be improved, thereby the signal line may have a better signal transmission.

The method of manufacturing the first common electrode layer 41 and the second common electrode layer 42 and the gate electrode layer 500 of the present embodiment is identical to those of the embodiment 1, and the other film layers in the present embodiment are sequentially made by the conventional manufacturing process, therefore the description will be omitted herein.

Embodiments 1-3 have following advantage effects: in the double-sided display substrate provided by the embodiments 1-3, since the common electrode layer corresponding to the back side light-emitting layer and/or the front side light-emitting layer is disposed in the same layer as the gate electrode layer of the driving transistor, the manufacturing of the double-sided display substrate can be implemented without influencing the existing process and increase the complexity thereof. Not only the thickness and the volume of the double-sided display substrate are effectively reduced, the manufacturing cost and the energy consumption cost of the double-sided display substrate are reduced, the difficulty in design is reduced, but also the production cycle of the display substrate is reduced, the yield of the display substrate and the display quality thereof are improved, such that quick manufacture and spread of the double-sided display substrate are realized.

Embodiment 4

The present embodiment provides a display device including the double-sided display substrate of any one of the embodiments 1-3.

Using the double-sided display substrate of any one of the embodiments 1-3, not only the manufacturing cost and the energy consumption cost of the display device are reduced, but also the production cycle of the display device is reduced, such that the yield of the display device and the display quality thereof are improved.

The display device may be any one of products and components having OLED displaying function, such as an OLED panel, an electronic paper, a mobile phone, a tablet, a TV, an OLED display, a laptop, a digital camera, a navigation, and the like.

It is to be understood, the foregoing implementations are merely exemplary embodiments for explaining the principle of the present invention, and the present invention is not limited thereto. Various modifications and improvements can be made for those skilled in the art without departing from the spirit and essence of the present invention, and these modifications and improvements shall also fall within the scope of the present invention.

The invention claimed is:

1. A double-sided display substrate comprising:
several sub-pixel units disposed in a pixel area, the sub-pixel unit includes:
a front side light-emitting layer provided for front side displaying;
a back side light-emitting layer provided for back side displaying;
a pixel electrode layer;
a common electrode layer; and
a driving transistor; and
each of the front side light-emitting layer and the back side light-emitting layer is interposed between a corresponding pixel electrode layer and the common electrode layer, the driving transistor controls the front side light-emitting layer and the back side light-emitting layer to emit light, wherein
the common electrode layer corresponding to the back side light-emitting layer and/or the front side light-emitting layer is disposed in the same layer as a gate electrode layer of the driving transistor.

2. The double-sided display substrate according to claim 1, wherein the sub-pixel unit includes a driving transistor, the driving transistor controls the front side light-emitting layer and the back side light-emitting layer commonly; the front side light-emitting layer and the back side light-emitting layer share the same pixel electrode layer, the common electrode layer include a first common electrode layer corresponding to the front side light-emitting layer and a second common electrode layer corresponding to the back side light-emitting layer; the second common electrode layer is disposed in the same layer as the gate electrode layer, the pixel electrode layer is connected to the driving transistor.

3. The double-sided display substrate according to claim 2, wherein the common electrode layer includes a transparent conductive material layer, the gate electrode layer includes at least two conductive material layers, the undermost conductive material layer of the gate electrode layer, which is closest to the back side light-emitting layer, is made of the same transparent conductive material as the common electrode layer, the conductive material layer above the undermost conductive material layer of the gate electrode layer is made of conductive metal material.

4. A display device comprising the double-sided display substrate of claim 2.

5. The double-sided display substrate according to claim 2, further includes a base substrate, the driving transistor is disposed on the base substrate, the gate electrode layer of the driving transistor is located above an active region thereof, a gate insulating layer is interposed between the gate electrode layer and the active region;

a first insulating layer is disposed on the gate electrode layer, a first opening area is formed at a position on the first insulating layer corresponding to the second common electrode layer, the back side light-emitting layer is disposed at a position on the first insulating layer corresponding to the first opening area, the back side light-emitting layer is connected to the second common electrode layer through the first opening area;

the pixel electrode layer is disposed on the back side light-emitting layer, the pixel electrode layer is connected to the back side light-emitting layer; a first via is formed at a position in the first insulating layer and the gate insulating layer corresponding to a drain of the driving transistor, the pixel electrode layer is connected to the drain through the first via;

a second insulating layer is disposed on the pixel electrode layer, a second opening area is formed at a position on the second insulating layer corresponding to the pixel electrode layer, the front side light-emitting layer is disposed at a position on the second insulating layer corresponding to the second opening area, the front side light-emitting layer is connected to the pixel electrode layer through the second opening area;

the first common electrode layer is disposed on the front side light-emitting layer, and the first common electrode layer is connected to the front side light-emitting layer.

6. The double-sided display substrate according to claim 5, wherein the common electrode layer includes a transparent conductive material layer, the gate electrode layer includes at least two conductive material layers, the undermost conductive material layer of the gate electrode layer, which is closest to the back side light-emitting layer, is made of the same transparent conductive material as the common electrode layer, the conductive material layer above the undermost conductive material layer of the gate electrode layer is made of conductive metal material.

7. A display device comprising the double-sided display substrate of claim 5.

8. The double-sided display substrate according to claim 1, wherein the sub-pixel unit includes a first driving transistor provided for controlling the front side light-emitting layer to emit light and a second driving transistor provided for controlling the back side light-emitting layer to emit light, the first driving transistor and the second driving transistor share the same gate electrode layer; the pixel electrode layer includes a first pixel electrode layer corresponding to the front side light-emitting layer and a second pixel electrode layer corresponding to the back side light-emitting layer, the front side light-emitting layer and the back side light-emitting layer share the same common electrode layer, the common electrode layer is disposed in the same layer as the gate electrode layer.

9. The double-sided display substrate according to claim 8, wherein the common electrode layer includes a transparent conductive material layer, the gate electrode layer includes at least two conductive material layers, the undermost conductive material layer of the gate electrode layer, which is closest to the back side light-emitting layer, is made of the same transparent conductive material as the common electrode layer, the conductive material layer above the undermost conductive material layer of the gate electrode layer is made of conductive metal material.

10. A display device comprising the double-sided display substrate of claim 8.

11. The double-sided display substrate according to claim 8, wherein on a projection plane parallel to display surfaces of the double-sided display substrate, projections of the first driving transistor and the second driving transistor are overlapped, projections of the front side light-emitting layer, the back side light-emitting layer, the first pixel electrode layer, the second pixel electrode layer and the common electrode layer are overlapped;

the front side light-emitting layer and the first pixel electrode layer are disposed sequentially on a side of the common electrode layer far away from the back side light-emitting layer, the back side light-emitting layer and the second pixel electrode layer are disposed sequentially on a side of the common electrode layer far away from the front side light-emitting layer, the front side light-emitting layer and the back side light-emitting layer are symmetrical with respect to the common electrode layer, the first pixel electrode layer and the second pixel electrode layer are symmetrical with respect to the common electrode layer, and the first pixel electrode layer, the front side light-emitting layer, the common electrode layer, the back side light-emitting layer and the second pixel electrode layer are contacted and connected with each other;

an active region of the first driving transistor and a source and a drain of the first driving transistor disposed at opposite ends on a side of the active region far away from the gate electrode layer, and an active region of the second driving transistor and a source and a drain of the second driving transistor disposed at opposite ends on a side of the active region far away from the gate electrode layer are symmetrical with respect to the gate electrode layer, a first gate insulating layer is interposed between the active region of the first driving transistor and the gate electrode layer, and a second gate insulating layer is interposed between the active region of the second driving transistor and the gate electrode layer;

a third insulating layer is further disposed on a side of the active region of the first driving transistor far away from the gate electrode layer, a second via is formed at a position of the third insulating layer corresponding to the drain of the first driving transistor, the first pixel electrode layer is connected to the drain of the first driving transistor through the second via; a fourth insulating layer is further disposed on a side of the active region of the second driving transistor far away from the gate electrode layer, a third via is formed at a position of the fourth insulating layer corresponding to the drain of the second driving transistor, the second pixel electrode is connected to the drain of the second driving transistor through the third via.

12. The double-sided display substrate according to claim 11, wherein the common electrode layer includes a transparent conductive material layer, the gate electrode layer includes at least two conductive material layers, the undermost conductive material layer of the gate electrode layer, which is closest to the back side light-emitting layer, is made of the same transparent conductive material as the common electrode layer, the conductive material layer above the undermost conductive material layer of the gate electrode layer is made of conductive metal material.

13. The double-sided display substrate according to claim 1, wherein the sub-pixel unit includes a first driving transistor provided for controlling the front side light-emitting layer to emit light and a second driving transistor provided for controlling the back side light-emitting layer to emit light, the first driving transistor and the second driving transistor share the same gate electrode layer, the pixel electrode layer includes a first pixel electrode layer corresponding to the front side light-emitting layer and a second pixel electrode layer corresponding to the back side light-emitting layer, the common electrode layer includes a first common electrode layer corresponding to the front side light-emitting layer and a second common electrode layer corresponding to the back side light-emitting layer, the first common electrode layer, the second common electrode layer and the gate electrode layer are disposed in the same layer.

14. The double-sided display substrate according to claim 13, wherein the common electrode layer includes a transparent conductive material layer, the gate electrode layer includes at least two conductive material layers, the undermost conductive material layer of the gate electrode layer, which is closest to the back side light-emitting layer, is made of the same transparent conductive material as the common electrode layer, the conductive material layer above the undermost conductive material layer of the gate electrode layer is made of conductive metal material.

15. The double-sided display substrate according to claim 13, wherein on a projection plane parallel to display surfaces of the double-sided display substrate, projections of the first driving transistor and the second driving transistor are overlapped, projections of the first common electrode layer and the second common electrode layer are located at both sides of the projection of the gate electrode layer, respectively;
the front side light-emitting layer and the first pixel electrode layer are sequentially disposed on a side of the first common electrode layer far away from the back side light-emitting layer, and the first common electrode layer, the front side light-emitting layer and the first pixel electrode layer are located at positions corresponding to each other and contacted with each other; the back side light-emitting layer and the second pixel electrode layer are sequentially disposed on a side of the second common electrode layer far away from the front side light-emitting layer, and the second common electrode layer, the back side light-emitting layer and the second pixel electrode layer are located at positions corresponding to each other and contacted with each other;
an active region of the first driving transistor and a source and a drain of the first driving transistor disposed at opposite ends on a side of the active region far away from the gate electrode layer, and an active region of the second driving transistor and a source and a drain of the second driving transistor disposed at opposite ends on a side of the active region far away from the gate electrode layer are symmetrical with respect to the gate electrode layer, a first gate insulating layer is interposed between the active region of the first driving transistor and the gate electrode layer, and a second gate insulating layer is interposed between the active region of the second driving transistor and the gate electrode layer;
a third insulating layer is further disposed on a side of the active region of the first driving transistor far away from the gate electrode layer, a second via is formed at a position of the third insulating layer corresponding to the drain of the first driving transistor, the first pixel electrode layer is connected to the drain of the first driving transistor through the second via; a fourth insulating layer is further disposed on a side of the active region of the second driving transistor far away from the gate electrode layer, a third via is formed at a position of the fourth insulating layer corresponding to the drain of the second driving transistor, the second pixel electrode is connected to the drain of the second driving transistor through the third via.

16. The double-sided display substrate according to claim 15, wherein the common electrode layer includes a transparent conductive material layer, the gate electrode layer includes at least two conductive material layers, the undermost conductive material layer of the gate electrode layer, which is closest to the back side light-emitting layer, is made of the same transparent conductive material as the common electrode layer, the conductive material layer above the undermost conductive material layer of the gate electrode layer is made of conductive metal material.

17. The double-sided display substrate according to claim 1, wherein the common electrode layer includes a transparent conductive material layer, the gate electrode layer includes at least two conductive material layers, the undermost conductive material layer of the gate electrode layer, which is closest to the back side light-emitting layer, is made of the same transparent conductive material as the common electrode layer, the conductive material layer above the undermost conductive material layer of the gate electrode layer is made of conductive metal material.

18. The double-sided display substrate according to claim 17, wherein a signal line in a signal line region out of the pixel area has the same structure as the gate electrode layer.

19. A display device comprising the double-sided display substrate of claim 1.

20. A method for manufacturing the double-sided display substrate of claim 1, comprising the steps of:
forming the driving transistor, the front side light-emitting layer, the back side light-emitting layer, the pixel electrode layer and the common electrode layer on the base substrate, each of the front side light-emitting layer and the back side light-emitting layer is interposed between a corresponding pixel electrode layer and the common electrode layer, wherein the common electrode layer corresponding to the back side light-emitting layer and/or the front side light-emitting layer is formed simultaneously with the gate electrode layer of the driving transistor using a single patterning process.

* * * * *